(12) United States Patent
Endo et al.

(10) Patent No.: US 12,707,988 B2
(45) Date of Patent: Aug. 11, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yoshiki Endo, Kawasaki Kanagawa (JP); Taiji Takahashi, Fukaya Saitama (JP)

(73) Assignees: Kabushiki Kaisha Toshiba, Kawasaki (JP); Toshiba Electronic Devices & Storage Corporation, Kawasaki (JP)

(*) Notice: Subject to any disclaimer, the term of this patent is extended or adjusted under 35 U.S.C. 154(b) by 385 days.

(21) Appl. No.: 18/462,109

(22) Filed: Sep. 6, 2023

(65) Prior Publication Data

US 2024/0421046 A1 Dec. 19, 2024

(30) Foreign Application Priority Data

Mar. 20, 2023 (JP) ................................ 2023-044261

(51) Int. Cl.
*H10W 70/40* (2026.01)
*H10W 72/00* (2026.01)
(Continued)

(52) U.S. Cl.
CPC ....... *H10W 70/424* (2026.01); *H10W 70/481* (2026.01); *H10W 72/07354* (2026.01);
(Continued)

(58) Field of Classification Search
CPC ... H01L 23/49562; H01L 24/83; H01L 24/29; H01L 24/33; H01L 24/32; H01L 23/49548; H01L 21/565; H01L 23/3121; H01L 23/49575; H01L 23/051; H01L 23/4952; H01L 23/49568; H01L 23/49513; H01L 21/4825; H01L 23/3114; H01L 2924/13091; H01L 2224/32245;
(Continued)

(56) References Cited

U.S. PATENT DOCUMENTS 5,578,869 A * 11/1996 Hoffman ........... H01L 23/49894 257/730
2004/0159962 A1* 8/2004 Ishiyama .......... H01L 23/49575 257/E23.098

(Continued)

FOREIGN PATENT DOCUMENTS

JP S5011770 A 2/1975
JP H09298262 A 11/1997

(Continued)

OTHER PUBLICATIONS

Notice of Reasons for Refusal (Office Action) dated Mar. 10, 2026 mailed in counterpart Japanese Patent Application No. 2023-044261, with English machine translation, 9 pages.

*Primary Examiner* — Mouloucoulaye Inoussa
(74) *Attorney, Agent, or Firm* — Kim & Stewart LLP

(57) ABSTRACT

According to one embodiment, a semiconductor device includes a pellet; a first conductor and a second conductor between which the pellet is interposed in a first direction; a first bonding material that bonds the pellet and the first conductor; and a second bonding material that bonds the pellet and the second conductor. A first surface of the first conductor facing the pellet has a depression.

18 Claims, 7 Drawing Sheets

(51) Int. Cl.
*H10W 72/30* (2026.01)
*H10W 90/00* (2026.01)

(52) U.S. Cl.
CPC ........ *H10W 72/347* (2026.01); *H10W 72/352* (2026.01); *H10W 90/736* (2026.01)

(58) Field of Classification Search
CPC . H01L 2224/29155; H01L 2924/13055; H01L 2224/33181; H01L 2224/83815; H01L 2224/32225; H01L 2224/26175; H01L 2224/48091; H01L 2924/181; H01L 2224/2612; H01L 2224/73265
See application file for complete search history.

(56) References Cited

U.S. PATENT DOCUMENTS

2005/0121784 A1* 6/2005 Standing ................. H01L 24/27 257/E23.178
2008/0074829 A1* 3/2008 Kashiwazaki ......... H05K 1/181 361/600
2012/0001341 A1* 1/2012 Ide .......................... H01L 23/40 257/773
2013/0001764 A1* 1/2013 Stella ...................... H01L 21/56 438/122
2013/0006605 A1* 1/2013 Hogan .................. G06Q 10/10 704/2
2013/0093072 A1* 4/2013 Zhang ............... H01L 23/49513 257/676
2013/0285229 A1* 10/2013 Stella ................. H01L 23/3677 257/692
2014/0374895 A1* 12/2014 Kadoguchi ......... H01L 23/4334 257/707
2016/0218047 A1* 7/2016 Okumura ............ H01L 23/3114
2016/0304992 A1 10/2016 Kurata et al.
2017/0250125 A1 8/2017 Arokiasamy et al.
2017/0278774 A1* 9/2017 Hayashi .................. H01L 25/50
2018/0277462 A1* 9/2018 Takahagi .......... H01L 23/49562
2019/0013261 A1* 1/2019 Shiizaki .............. H01L 23/3735
2019/0355656 A1* 11/2019 Hayashi ............ H01L 23/49568
2020/0075464 A1* 3/2020 Kojima ............. H01L 23/49513
2022/0093554 A1* 3/2022 Takeda .................... H01L 24/73
2022/0399253 A1* 12/2022 Nakamura ............ H01L 23/295
2023/0089603 A1* 3/2023 Koike ..................... H01L 24/40 257/676

FOREIGN PATENT DOCUMENTS

| | | | |
|---|---|---|---|
| JP | 2004087609 | A | 3/2004 |
| JP | 2007-096042 | A | 4/2007 |
| JP | 2008153432 | A | 7/2008 |
| JP | 2009170702 | A | 7/2009 |
| JP | 2012-104709 | A | 5/2012 |
| JP | 2013-016603 | A | 1/2013 |
| JP | 5510623 | B1 | 6/2014 |
| JP | 2015095473 | A | 5/2015 |
| JP | 7111140 | B2 | 8/2022 |

* cited by examiner

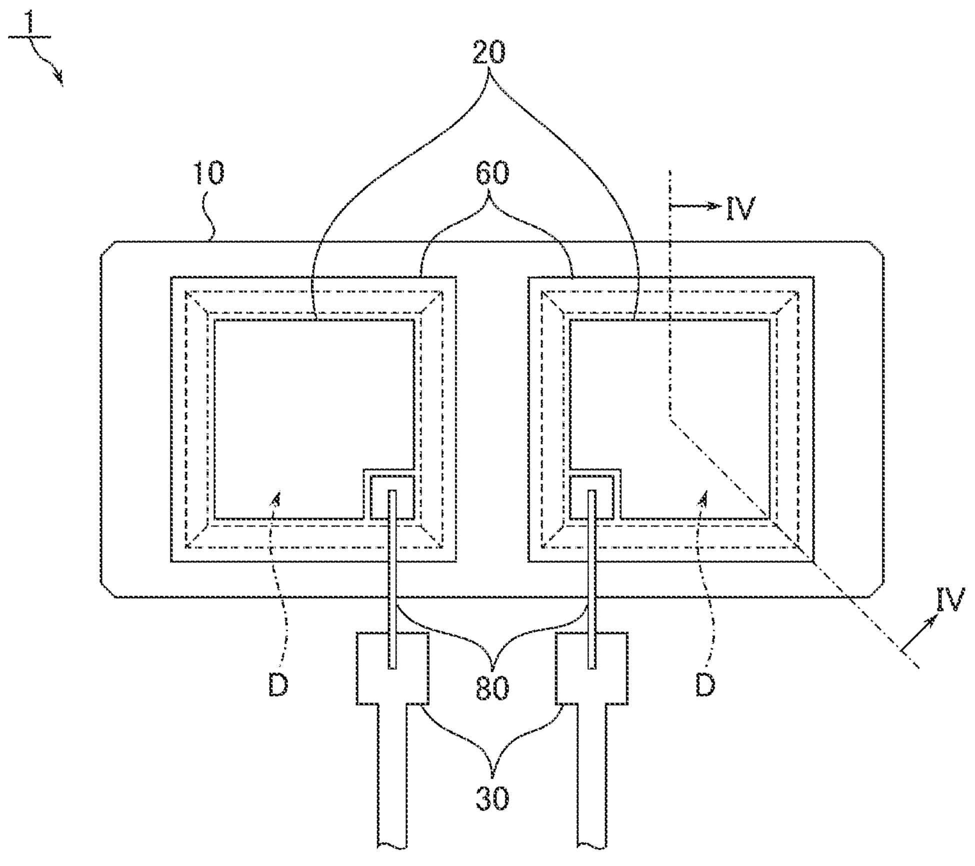
F I G. 3
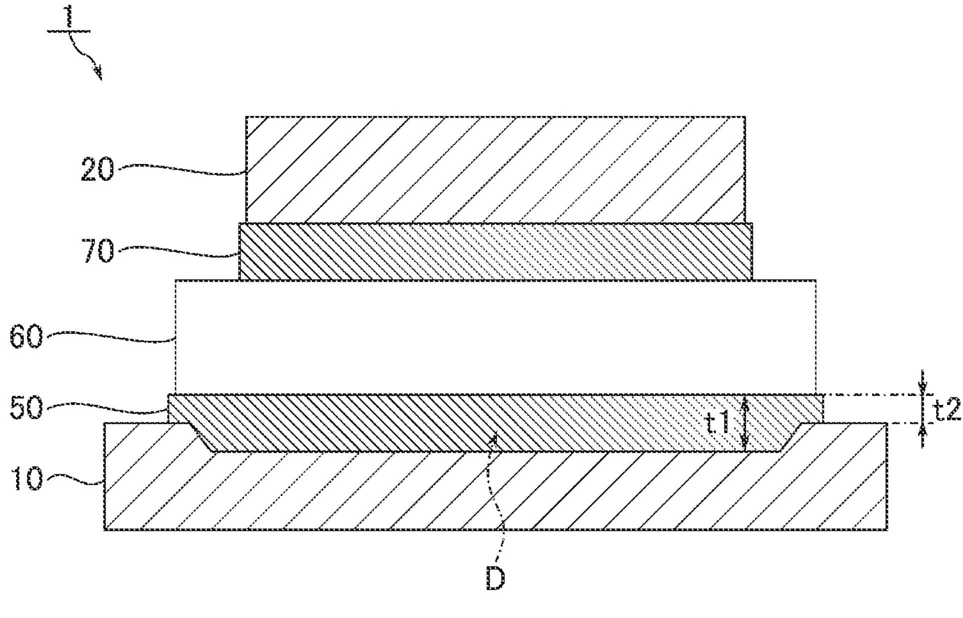
F I G. 4

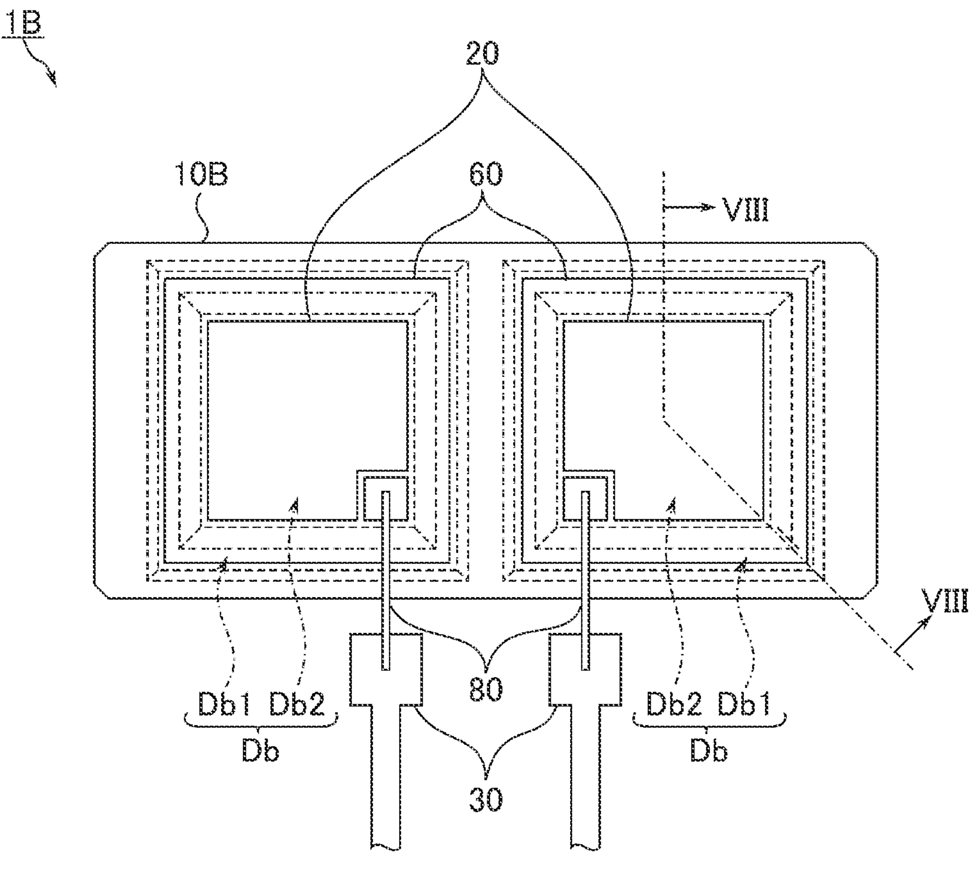
F I G. 7
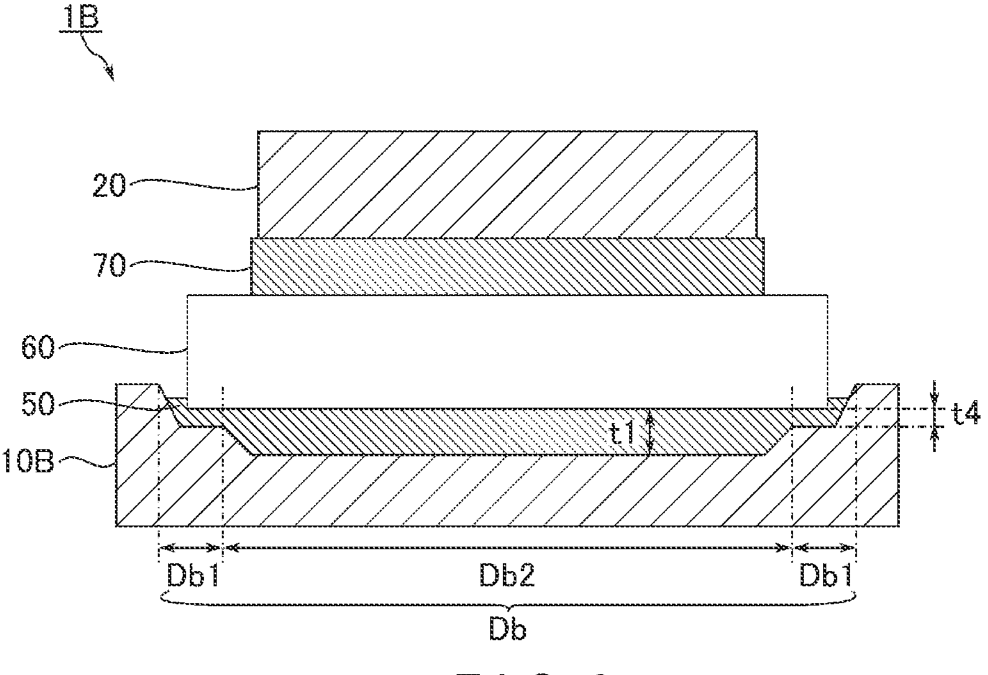
F I G. 8

SEMICONDUCTOR DEVICE

CROSS-REFERENCE TO RELATED APPLICATION

This application is based upon and claims the benefit of priority from Japanese Patent Application No. 2023-044261, filed Mar. 20, 2023, the entire contents of which are incorporated herein by reference.

FIELD

Embodiments described herein relate generally to a semiconductor device.

BACKGROUND

A semiconductor having a structure in which each of the top and bottom surfaces of a pellet is coupled to a conductor via a bonding material.

BRIEF DESCRIPTION OF THE DRAWINGS

FIG. 3 is a plan view showing an exemplary planar layout of the semiconductor device according to the first embodiment.

FIG. 4 is a sectional view taken along line IV-IV indicated in FIG. 3 and shows an exemplary sectional structure of the semiconductor device according to the first embodiment.

FIG. 7 is a plan view showing an exemplary planar layout of the semiconductor device according to a third embodiment.

FIG. 8 is a sectional view taken along line VIII-VIII indicated in FIG. 7 and shows an exemplary sectional structure of the semiconductor device according to the third embodiment.

DETAILED DESCRIPTION

Figure 1:
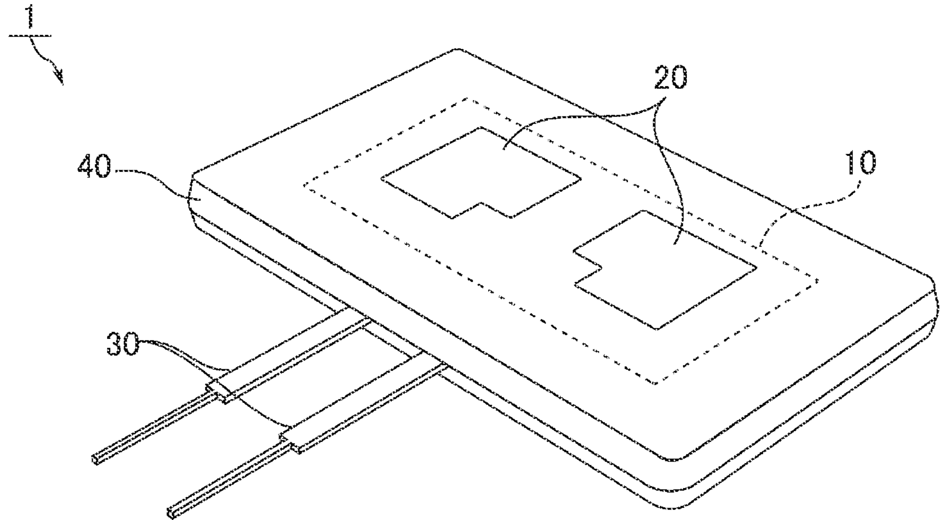
FIG. 1 is a perspective view showing an exemplary outer appearance of a semiconductor device according to a first embodiment.

In general, according to one embodiment, a semiconductor device includes a semiconductor device includes a pellet; a first conductor and a second conductor between which the pellet is interposed in a first direction; a first bonding material that bonds the pellet and the first conductor; and a second bonding material that bonds the pellet and the second conductor. A first surface of the first conductor facing the pellet has a depression.

Hereinafter, embodiments will be described with reference to the drawings. The dimensions, scales, etc., used in the drawings are not binding on actual products.

The description will use the same reference signs for elements or components having the same or substantially the same functions and configurations. For the purpose of distinguishing between elements having the same or substantially the same configurations, the description may add different characters or numerals after their respective reference signs.

1. First Embodiment

A semiconductor device according to a first embodiment is described.

FIG. 1 is a perspective view showing an exemplary outer appearance of a semiconductor device according to the first embodiment. The semiconductor device 1 is an industrial power device. The semiconductor device 1 has a shape of a thin, rectangular parallelepiped, for example. Hereinafter, a thickness direction of the semiconductor device 1 is called a vertical direction. If a component of the semiconductor device 1 has two surfaces facing each other in the vertical direction, these surfaces are called a "bottom surface" and a "top surface", respectively.

The semiconductor device 1 includes a collector electrode 10, two emitter electrodes 20, two gate electrodes 30, and a sealing material 40. Each of the collector electrode 10, the two emitter electrodes 20, and the two gate electrodes 30 has a portion exposed outside of the sealing material 40, which serves as a terminal for external electric coupling.

The collector electrode 10 and the two emitter electrodes 20 are provided in such a manner that they are exposed to the lower surface and the upper surface of the sealing material 40, respectively. For example, the exposed surface of the collector electrode 10 and the exposed surfaces of the two emitter electrodes 20 are flush with the bottom surface and the top surface of the sealing material 40, respectively. When viewed in the thickness direction, the exposed surface of each of the two emitter electrodes 20 is included in the inside of the exposed surface of the collector electrode 10.

The two gate electrodes 30 are provided in such a manner that they are exposed to the side surface of the sealing material 40. For example, the two gate electrodes 30 project from the side surface of the sealing material 40.

The sealing material 40 is an insulating member that physically and electrically protects the inner structure of the semiconductor device 1 against external threats. The sealing material 40 constitutes an outer shape of the semiconductor device 1.

Figure 2:
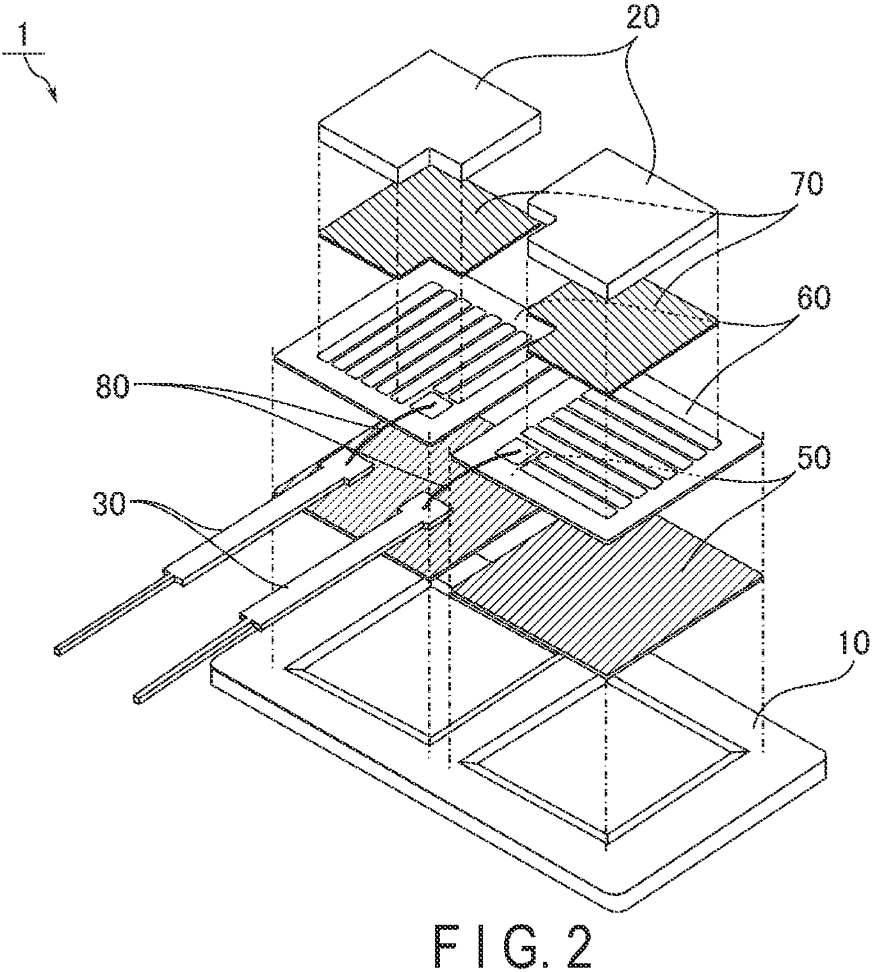
FIG. 2 is an exploded perspective view showing an exemplary inner structure of the semiconductor device according to the first embodiment.

FIG. 2 is an exploded perspective view showing an exemplary inner structure of the semiconductor device according to the first embodiment. FIG. 2 schematically shows the inner structure of the semiconductor device 1 broken down in the thickness direction. The sealing material 40 is omitted in FIG. 2. In addition to the collector electrode 10, the two emitter electrodes 20, and the two gate electrodes 30, the semiconductor device 1 further includes, as an inner structure, two bonding materials 50, two pellets 60, two bonding materials 70, and two wires 80.

Each of the collector electrode 10 and the emitter electrodes 20 is a copper plate having a thickness on the order of 1.5 mm, for example. The bottom surface of the collector electrode 10 corresponds to the surface on which the collector electrode 10 is exposed from the sealing material 40. The bottom surface of the collector electrode 10 is flat over the entire surface, for example. The top surface of the emitter electrode 20 corresponds to the surface on which the emitter electrode 20 is exposed from the sealing material 40. The top surface of the emitter electrode 20 is flat over the entire surface, for example.

Two bonding materials 50 are separately provided on the top surface of the collector electrode 10. The bonding material 50 is, for example, plate-shaped solder. A corresponding pellet 60 is provided on the top surface of the bonding material 50.

The pellet 60 is a chip of a power semiconductor. Specifically, the pellet 60 is, for example, an insulated gate bipolar transistor (IGBT) or a metal-oxide-silicon field-effect transistor (MOSFET) using silicon carbide (SiC). If the pellet 60 is a MOSFET using SiC, the collector electrode 10 and the emitter electrodes 20 are a drain electrode and source electrodes, respectively.

The bottom surface of the pellet 60 is used as an electrode corresponding to a collector. The bottom surface of the pellet 60 is electrically coupled to the collector electrode 10, via the bonding material 50. The area of the bottom surface of the pellet 60 is smaller than that of the collector electrode 10. A pad corresponding to the emitter and a pad corresponding to the gate are provided on the top surface of the pellet 60. The area of the top surface of the pellet 60 is larger than that of the emitter electrode 20.

On the top surface of the pellet 60, a corresponding bonding material 70 is provided in a region that includes the pad corresponding to the emitter but excludes the pad corresponding to the gate. The bonding material 70 is, for example, plate-shaped solder. The corresponding emitter electrode 20 is provided on the upper surface of the bonding material 70.

On the top surface of the pellet 60, one end of a corresponding wire 80 is provided on the pad corresponding to the gate. The wire 80 is a bonding wire. The other end of the wire 80 is coupled to the corresponding one of the gate electrodes 30.

With the above-described configuration, in the inside of the semiconductor device 1, three terminals used for inputting and outputting to and from the pellet 60 are electrically coupled to the collector electrode 10, the emitter electrode 20, and the gate electrode 30, respectively. The bonding materials 50 and 70 have a function of releasing heat generated in the pellet 60 in a vertical direction, as well as a function of an electrical coupling between the terminals and the pellet 60.

The example wherein two pellets 60 are provided in the semiconductor device 1 is explained with reference to FIGS. 1 and 2; however, the embodiment is not limited to this example. The number of the pellets 60 provided in the semiconductor device 1 may be one, three, or more.

FIG. 3 is a plan view showing an exemplary planar layout of the semiconductor device according to the first embodiment. FIG. 4 is a sectional view taken along line IV-IV indicated in FIG. 3 and shows an exemplary sectional structure of the semiconductor device according to the first embodiment. The sealing material 40 is not shown in FIGS. 3 and 4.

Two depressions D are formed in the top portion of the collector electrode 10. In the top surface of the collector electrode 10, the regions corresponding to the inner portions of the depressions D are located lower than the region corresponding to the portion outside of the depressions D (located further away from the pellet 60). The area of the depression D when viewed in the vertical direction is smaller than the area of the bottom surface of the corresponding pellet 60. The depressions D are included in the bottom surface of the corresponding pellet 60 when viewed in the vertical direction. In other words, the bottom surface of the pellet 60 overlaps the depressions D and the region outside of the depressions D surrounding the depressions D when viewed in the vertical direction.

The bonding material 50 is provided in such a manner that the corresponding depression D is embedded by the bonding material 50. The bonding material 50 is designed to have a maximum thickness t1 between the collector electrode 10 and the pellet 60 of 100 μm or greater, for example. A lower limit value is set for the maximum thickness t1 of the bonding material 50 in order to meet a request for a thickness required to ensure an occurrence of a short circuit between the collector electrode 10 and the pellet 60 when the pellet 60 malfunctions. The bonding material 50 is designed in such a manner that an upper limit value of the maximum thickness t1 is 300 μm or greater and 500 μm or less, for example.

The bonding material 50 may contain spherical nickel (Ni). The maximum value of the diameter of the spherical nickel contained in the bonding material 50 is on the order of 80 μm, for example. By including such spherical nickel in the bonding material 50, it is possible to design the portion of the bonding material 50 located above the depression D to have a thickness t2 less than 90 μm, for example. The bonding material 50 does not necessarily contain spherical nickel. In this case, the thickness t2 of the portion of the bonding material 50 located above the depression D may be thin enough to be negligible.

The bonding material 50 is designed in such a manner that the thickness (t1-t2) of the portion in which the depression D is embedded satisfies the above-described restrictions on the thickness t1 and is associated with the designed value of the thickness t2.

The semiconductor device 1 having the above-described configuration can be formed by filling the space between the collector electrode 10 and the pellets 60 with the bonding material 50, subsequently filling the space between the pellet 60 and the emitter electrodes 20 with the bonding material 70, and then pressing an assembly of the components in the vertical direction using a weight, etc. (not shown). Thus, in this process, a force squeezing the bonding material 50 out of the pellets 60 and the collector electrode 10 is applied to the bonding material 50. For this reason, if no depressions D are formed in the collector electrode 10, it would be difficult to keep the thickness of the bonding material 50 to 100 μm or greater, even if the bonding material 50 contains spherical nickel.

According to the first embodiment, a depression D is formed in the upper portion of the collector electrode 10. The region in which the depression D is formed is smaller than the bottom surface of the pellet 60 and included in the bottom surface of the pellet 60, when viewed in the vertical direction. It is thereby possible to couple the collector electrode 10 to the pellets 60 via the bonding material 50 formed in the depressions D, even when these components are pressed in the vertical direction during the manufacturing process. The depression D is formed in such a manner that the thickness t1 of the bonding material 50 is 100 μm or greater. For this reason, the collector electrode 10 and the pellet 60 can be short-circuited without fail when the pellet 60 malfunctions. Accordingly, it is possible to suppress degradation of the reliability of the semiconductor device 1.

2. Second Embodiment

Next, a semiconductor device according to a second embodiment is described. The second embodiment differs from the first embodiment in that a bonding material 50 having a significant thickness is ensured even outside of the depressions D. In the following description, only the structures different from the first embodiment are described. Descriptions of structures similar to those of the first embodiment are omitted.

Figure 5:
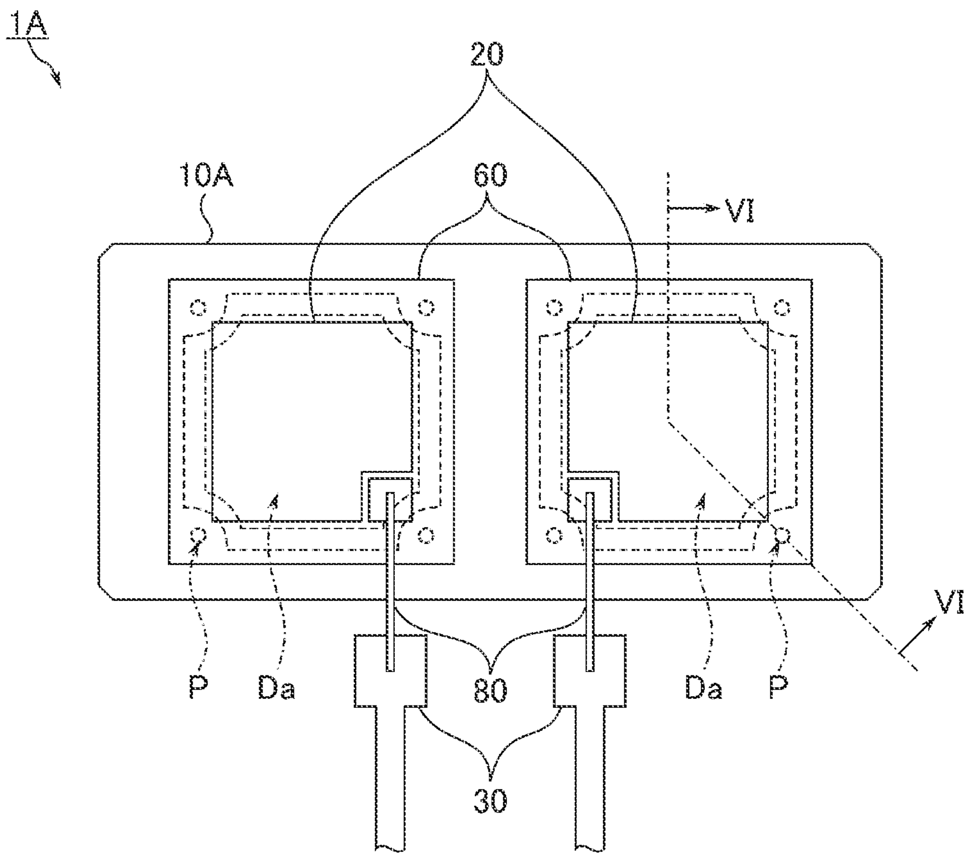
FIG. 5 is a plan view showing an exemplary planar layout of the semiconductor device according to a second embodiment.
Figure 6:
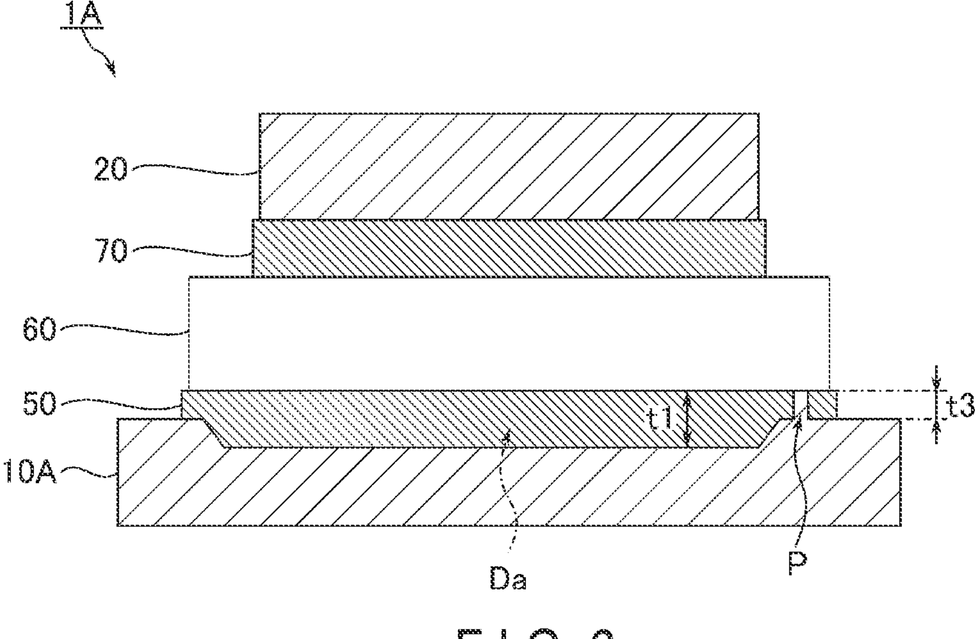
FIG. 6 is a sectional view taken along line VI-VI indicated in FIG. 5 and shows an exemplary sectional structure of the semiconductor device according to the second embodiment.

FIG. 5 is a plan view showing an exemplary planar layout of the semiconductor device according to the second embodiment. FIG. 6 is a sectional view taken along line VI-VI indicated in FIG. 5 and shows an exemplary sectional structure of the semiconductor device according to the second embodiment. FIGS. 5 and 6 correspond to FIGS. 3 and 4 in the first embodiment.

As shown in FIGS. 5 and 6, the semiconductor device 1A includes a collector electrode 10A, two emitter electrodes 20, two gate electrodes 30, a sealing material 40 (not shown), two bonding materials 50, two pellets 60, two bonding materials 70, and two wires 80. The two emitter electrodes 20, the two gate electrodes 30, the sealing material 40, the two bonding materials 50, the two pellets 60, the two bonding materials 70, and the two wires 80 are the same as those in the first embodiment.

Two depressions Da and eight projections P are formed on the top portion of the collector electrode 10A. In the top surface of the collector electrode 10A, the region corresponding to the inner portions of the depressions Da is located below the region corresponding to the outside of the depressions Da. Four projections P of eight projections P correspond to one depression Da. Four projections P are arranged at four corners around the outside of the corresponding depression Da respectively.

The area of the depression Da when viewed in the vertical direction is smaller than the area of the bottom surface of the corresponding pellet 60. The depression Da is included in the bottom surface of the corresponding pellet 60 when viewed in the vertical direction. The four projections P are included in the bottom surface of the corresponding pellet 60 when viewed in the vertical direction. Thus, the pellet 60 is arranged in such a manner that it is in contact with both of the upper ends of the projections P and the top surface of the bonding material 50.

The height t3 of the projections P is designed to be less than 100 μm, for example. By making the height t3 of the projections P less than 100 μm, when the projections P are formed in the collector electrode 10A, it is possible to prevent a formation of a depression as a by-product in a region that overlaps the projections P in the bottom surface of the collector electrode 10A when viewed in the vertical direction. Thus, by making the height t3 of the projections P less than 100 μm, impairment of the flatness of the bottom surface of the collector electrode 10A can be suppressed.

The bonding material 50 is provided in such a manner that the corresponding depression Da is embedded by the bonding material 50. A request for a maximum thickness t1 for the bonding material 50 between the collector electrode 10A and the pellet 60 is similar to the request in the first embodiment. The bonding material 50 is designed in such a manner that the thickness (t1-t3) of the portion in which the depression Da is embedded satisfies the above-described restrictions on the thickness t1 and is associated with the designed value of the height t3.

According to the second embodiment, the depressions Da and the projections P are formed in the upper portion of the collector electrode 10A. The projections P are formed at four corners around the outside of the depression Da. The region in which the depression Da and the projections P are formed is, when viewed in the vertical direction, smaller than the bottom surface of the pellet 60 and included in the bottom surface of the pellet 60. It is thereby possible to ensure that the thickness t1 of the bonding material 50 provided between the collector electrode 10A and the pellet 60 is approximately the same as the sum of the height t3 of the projections P and the depth of the depressions Da, even when these components are pressed in the vertical direction during the manufacturing process. The bonding material 50 is designed in such a manner that the above sum is 100 μm or greater. For this reason, the collector electrode 10A and the pellet 60 can be short-circuited without fail when the pellet 60 malfunctions. Accordingly, it is possible to suppress degradation of the reliability of the semiconductor device 1A.

When the pellet 60 is pressed in the vertical direction in the manufacturing process, the pellet 60 is supported by the projections P. Thus, it is possible to prevent the bonding material 50 located outside the depressions Da from being squeezed out of the space between the pellet 60 and the collector electrode 10A. For this reason, it is possible to ensure that the thickness of the bonding material 50 located outside the depressions Da is on the order of the height t3 of the projections P. Therefore, the bonding material 50 located outside the depressions Da can mitigate a stress caused between the collector electrode 10A and the pellet 60.

The projections are designed in such a manner that the height t3 of each of the projections P is less than 100 μm. It is thereby possible to prevent a formation of a depression that would damage the flatness of the bottom surface of the collector electrode 10A. Thus, it is possible to suppress degradation of solder wettability on the bottom surface of the collector electrode 10A. Therefore, it is possible to suppress degradation of reliability in the case where the bottom surface of the collector electrode 10A is coupled to an external device of the semiconductor device 1A by soldering.

3. Third Embodiment

Next, a semiconductor device according to a third embodiment is described. The third embodiment differs from the first and second embodiments in that the area of the depression formed on the upper portion of the collector electrode when viewed in the vertical direction is larger than the area of the bottom surface of the pellet. In the following description, only the structures different from the first embodiment are described. Descriptions of structures similar to those of the first embodiment are omitted.

FIG. 7 is a plan view showing an exemplary planar layout of the semiconductor device according to the third embodiment. FIG. 8 is a sectional view taken along line VIII-VIII indicated in FIG. 7 and shows an exemplary sectional structure of the semiconductor device according to the third embodiment. FIGS. 7 and 8 correspond to FIGS. 3 and 4 in the first embodiment.

As shown in FIGS. 7 and 8, the semiconductor device 1B includes a collector electrode 10B, two emitter electrodes 20, two gate electrodes 30, a sealing material 40 (not shown), two bonding materials 50, two pellets 60, two bonding materials 70, and two wires 80. The two emitter electrodes 20, the two gate electrodes 30, the sealing material 40, the two bonding materials 50, the two pellets 60, the two bonding materials 70, and the two wires 80 are the same as those in the first embodiment.

Two depressions Db are formed on the top portion of the collector electrode 10B. In the top surface of the collector electrode 10B, the regions corresponding to the inner portions of the depressions Db are located below the region corresponding to the outside of the depressions Db.

When viewed in the vertical direction, the depression Db can be divided into regions Db1 and Db2. The region Db2 corresponds to the center portion of the depression Db. The region Db1 corresponds to the peripheral portion of the depression Db (namely, the outer periphery of the region Db2). The depth of the depression Db is greater in the region Db2 than in the region Db1.

The area of the depression Db when viewed in the vertical direction is larger than the area of the bottom surface of the corresponding pellet 60. The region Db2 of the depression Db when viewed in the vertical direction is smaller than the area of the bottom surface of the corresponding pellet 60. In other words, when viewed in the vertical direction, the peripheral portion of the bottom surface of the pellet 60 overlaps the region Db1 of the corresponding depression Db.

The bonding material 50 is provided in such a manner that, of the corresponding depression Db, the region Db2 and part of the region Db1 are embedded by the bonding material 50. A request for a maximum thickness t1 for the bonding material 50 between the collector electrode 10B and the pellet 60 is similar to the request in the first embodiment.

The bonding material 50 may contain spherical nickel. The maximum value of the diameter of the spherical nickel contained in the bonding material 50 is on the order of 80 μm, for example. By including such spherical nickel in the bonding material 50, the bonding material 50 in the region Db1 of the depression Db between the collector electrode 10B and the pellet 60 can be designed to have a thickness t4 less than 90 μm, for example. The bonding material 50 does not necessarily contain spherical nickel. In this case, the thickness t4 of the bonding material 50 in the region Db1 of the depression Db interposed between the collector electrode 10B and the pellet 60 may be thin enough to be negligible.

The bonding material 50 is designed in such a manner that the thickness (t1-t4) of the portion in which the region Db2 of the depression Db is embedded satisfies the above-described restrictions on the thickness t1 and is associated with the designed value of the thickness t4.

According to the third embodiment, a depression Db is formed in the upper portion of the collector electrode 10B. When viewed in the vertical direction, the area of the depression Db is larger than the area of the bottom surface of the corresponding pellet 60. The depression Db includes the region Db1 located at the peripheral portion of the depression Db when viewed in the vertical direction and the region Db2 located at the central portion. The region Db1 overlaps the peripheral portion of the bottom surface of the pellet 60 when viewed in the vertical direction. It is thereby possible to ensure that the thickness t1 of the bonding material 50 provided between the collector electrode 10B and the pellet 60 is similar at least to the difference between the depth in the region Db2 and the depth in the region Db1, even when these components are pressed in the vertical direction during the manufacturing process. The bonding material is designed in such a manner that the difference is 100 μm or greater. For this reason, the collector electrode 10B and the pellet 60 can be short-circuited without fail when the pellet 60 malfunctions. Accordingly, it is possible to suppress degradation of the reliability of the semiconductor device 1B.

As described above, when viewed in the vertical direction, the area of the depression Db is greater than the area of the bottom surface of the pellet 60. Thus, it is possible to keep the bonding material 50 that is squeezed out of the space between the pellet 60 and the collector electrode 10B during the manufacturing process within the region Db1 of the depression Db. For this reason, it is possible to prevent unintentional short-circuiting between two neighboring pellets 60, for example. Accordingly, it is possible to suppress degradation of the reliability of the semiconductor device 1B.

4. Fourth Embodiment

Next, a semiconductor device according to a fourth embodiment is described. The fourth embodiment differs from the third embodiment in that the projecting part of the collector electrode is in contact with the pellet in the inside of the depression. In the following description, only the structures different from the third embodiment are described. Descriptions of structures similar to those of the third embodiment are omitted.

Figure 9:
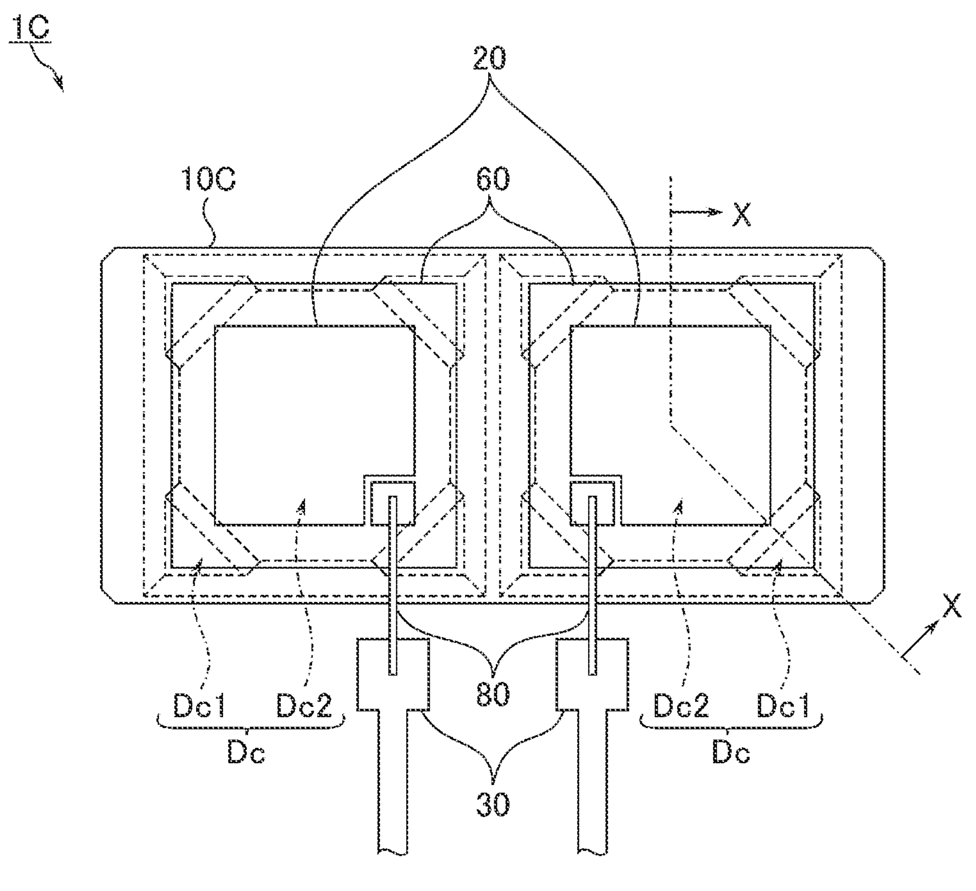
FIG. 9 is a plan view showing an exemplary planar layout of the semiconductor device according to a fourth embodiment.
Figure 10:
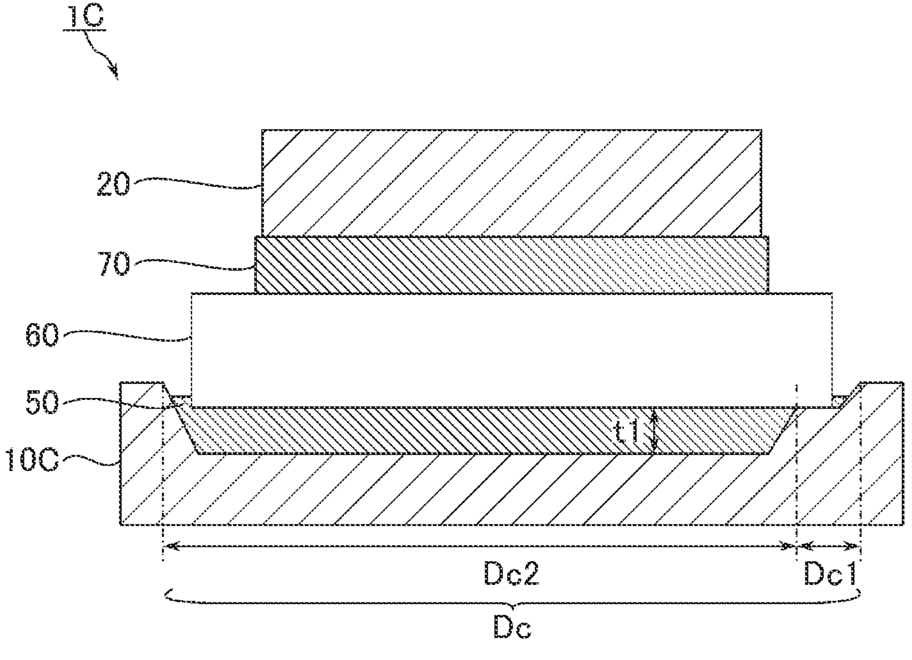
FIG. 10 is a sectional view taken along line X-X indicated in FIG. 9 and shows an exemplary sectional structure of the semiconductor device according to the fourth embodiment.

FIG. 9 is a plan view illustrating an example of a planar layout of the semiconductor device according to the fourth embodiment. FIG. 10 is a sectional view taken along the line X-X plane indicated in FIG. 9 and shows an exemplary sectional structure of the semiconductor device according to the fourth embodiment. FIGS. 9 and 10 correspond to FIGS. 7 and 8 in the third embodiment, respectively.

As shown in FIGS. 9 and 10, the semiconductor device 1C includes a collector electrode 10C, two emitter electrodes 20, two gate electrodes 30, a sealing material 40 (not shown), two bonding materials 50, two pellets 60, two bonding materials 70, and two wires 80. The two emitter electrodes 20, the two gate electrodes 30, the sealing material 40, the two bonding materials 50, the two pellets 60, the two bonding materials 70, and the two wires 80 are the same as those in the third embodiment.

Two depressions Dc are formed on the top portion of the collector electrode 10C. In the top surface of the collector electrode 10C, the region corresponding to the inner portions of the depressions Dc is located below the region corresponding to the outside of the depressions Dc.

When viewed in the vertical direction, the depression Dc can be divided into regions Dc1 and Dc2. The region Dc1 corresponds to the four corners of the depression Dc. The region Dc2 corresponds to a region in the depression Dc excluding the region Dc1 (namely, the center portion and the peripheral portion in the region Dc). The depth of the depression Dc is greater in the region Dc2 than in the region Dc1. In the depression Dc, the region Dc1 may be regarded as a projection projecting toward the region Dc2.

The area of the depression Dc when viewed in the vertical direction is larger than the area of the bottom surface of the corresponding pellet 60. The area of the region Dc2 of the depression Dc when viewed in the vertical direction is smaller than the area of the bottom surface of the corresponding pellet 60. In other words, when viewed in the vertical direction, the four corners of the bottom surface of the pellet 60 overlap the region Dc1 of the corresponding depression Dc. In the region Dc1, the pellet 60 is provided in such a manner that it is in contact with the collector electrode 10C without the bonding material 50 being interposed therebetween.

The bonding material 50 is provided in such a manner that, of the corresponding depression Dc, the region Dc2 and the part that does not overlap the pellet 60 in the region Dc1 when viewed in the vertical direction are embedded by the bonding material 50. In the region Dc1 of the depression Dc, the bonding material 50 may be thin enough to be negligible. The bonding material 50 may contain spherical nickel (Ni). A request for a maximum thickness t1 for the bonding material 50 between the collector electrode 10C and the pellet 60 (namely, the thickness of the portion that embeds the region Dc2 of the depression Dc) is similar to the request in the third embodiment.

According to the fourth embodiment, a depression Dc is formed in the top portion of the collector electrode 10C. When viewed in the vertical direction, the area of the depression Dc is larger than the area of the bottom surface of the corresponding pellet 60. The depression Dc includes the region Dc1 located at the four corners of the depression Dc when viewed in the vertical direction and the region Dc2 located at the central portion and the peripheral portion. It is thereby possible to ensure that the thickness t1 of the bonding material 50 provided between the collector electrode 10C and the pellet 60 is similar at least to the sum of the depth in the region Dc2 and the depth in the region Dc1, even when these components are pressed in the vertical direction during the manufacturing process. The bonding material is designed in such a manner that the difference is 100 μm or greater. For this reason, the collector electrode 10C and the pellet 60 can be short-circuited without fail when the pellet 60 malfunctions. Accordingly, it is possible to suppress degradation of the reliability of the semiconductor device 1C.

As described above, when viewed in the vertical direction, the area of the depression Dc is larger than the area of the bottom surface of the pellet 60. Thus, it is possible to keep the bonding material 50 that is squeezed out of the space between the pellet 60 and the collector electrode 10C during the manufacturing process within the region Dc1 of the depression Dc. For this reason, it is possible to prevent unintentional short-circuiting between two neighboring pellets 60, for example. Accordingly, it is possible to suppress degradation of the reliability of the semiconductor device 1C.

As described above, the thickness of the bonding material 50 between the pellet 60 and the collector electrode 10C in the region Dc1 may be thin enough to be negligible. On the other hand, the bonding material 50 between the peripheral portion of the pellet 60 and the collector electrode 10C in the region Dc2 has a significant thickness. This allows reduction of an area in which the pellet 60 is in contact with the collector electrode 10C without the bonding material 50 being interposed therebetween. For this reason, a stress caused between the collector electrode 10C and the pellet 60 can be efficiently mitigated by the bonding material 50.

5. Modifications

Various modifications are applicable to the foregoing first to fourth embodiments.

5.1 First Modification

For example, in the foregoing first through fourth embodiments, a groove may be provided in the depression in order to prevent air from being caught when the inner area of the depression is embedded by welded solder. An example wherein the first modification is applied to the first embodiment is described hereinafter.

Figure 11:
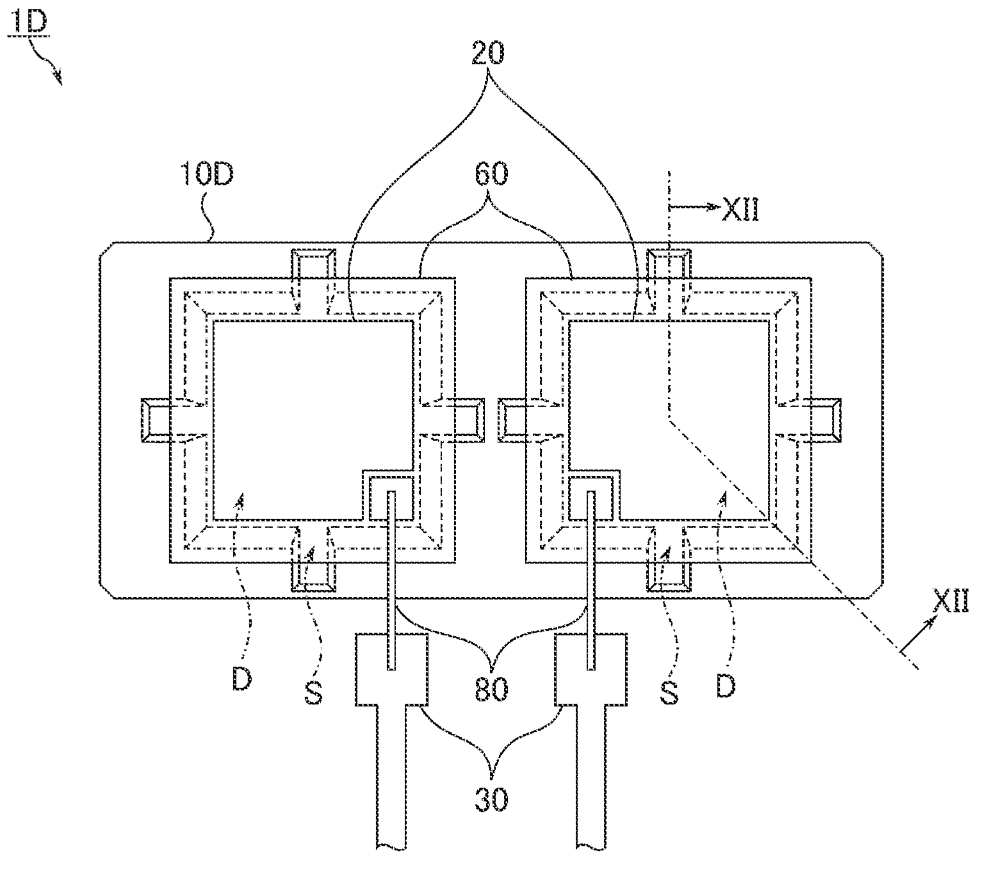
FIG. 11 is a plan view showing an exemplary planar layout of the semiconductor device according to a first modification.
Figure 12:
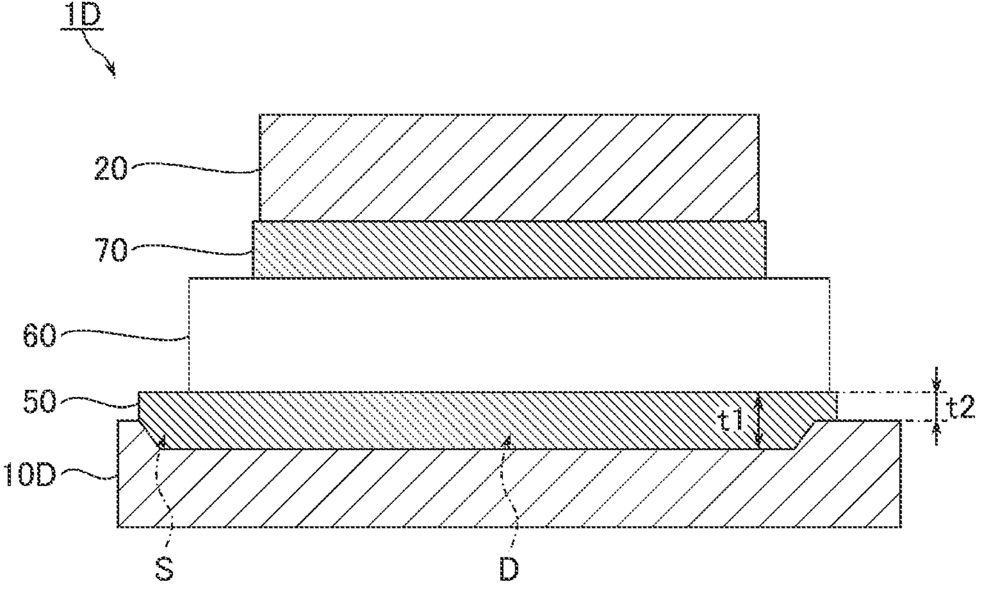
FIG. 12 is a sectional view taken along line XII-XII indicated in FIG. 11 and shows an exemplary sectional structure of the semiconductor device according to the first modification.

FIG. 11 is a plan view showing an exemplary planar layout of the semiconductor device according to a first modification. FIG. 12 is a sectional view taken along line XII-XII indicated in FIG. 11 and shows an exemplary sectional structure of the semiconductor device according to the first modification. FIGS. 11 and 12 correspond to FIGS. 3 and 4 in the first embodiment.

As shown in FIGS. 11 and 12, the semiconductor device 1D includes a collector electrode 10D, two emitter electrodes 20, two gate electrodes 30, a sealing material 40 (not shown), two bonding materials 50, two pellets 60, two bonding materials 70, and two wires 80. The two emitter electrodes 20, the two gate electrodes 30, the sealing material 40, the two bonding materials 50, the two pellets 60, the two bonding materials 70, and the two wires 80 are the same as those in the first embodiment.

Four grooves S of eight grooves S are formed so as to be coupled to one depression D. The grooves S extend from the side surface of the depression D toward the region that does not overlap the pellet 60 when viewed in the vertical direction. In other words, the grooves S form a space that connects the depression D to the top portion of the collector electrode 10D, without the part covered by the bottom surface of the collector electrode 10D being interposed therebetween. The space is used as a passage for discharging air remaining inside the depression D to the outside of the depression D when the depression D is embedded with the melted bonding material 50.

According to the first modification, the grooves S are provided in the collector electrode 10D below the pellet 60 in order to connect the inside to the outside of the depression D. It is thereby possible to suppress air remaining inside the depression D when the bonding material 50 is provided. For this reason, it is possible to prevent the substantial thickness of the bonding material 50 from being less than 100 μm due to the air remaining inside the depression D. Accordingly, it is possible to suppress degradation of the reliability of the semiconductor device 1D.

5.2 Second Modification

In the foregoing first through fourth embodiments, the case where depressions are formed in the collector electrode is described; however, the configuration is not limited thereto. The depressions, which are formed in the collector electrode in the foregoing first through fourth embodiments, may be formed in either one of the collector electrode or the emitter electrode. An example wherein a second modification is applied to the first embodiment is described hereinafter.

Figure 13:
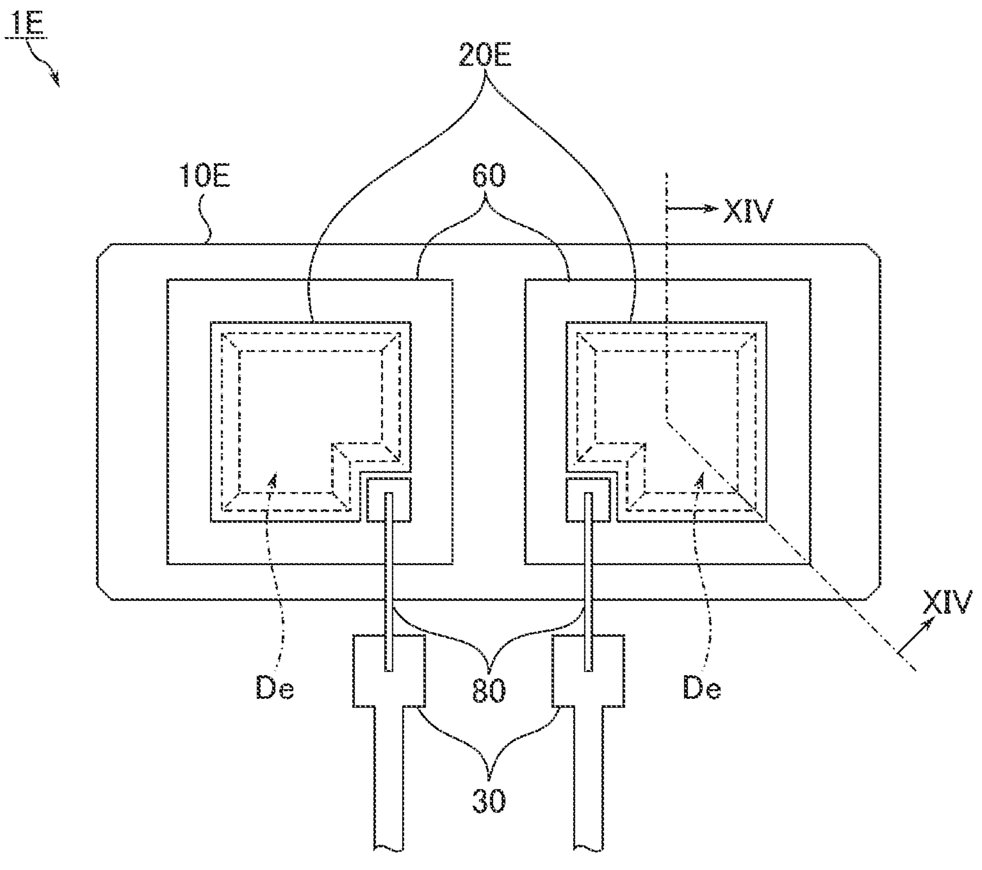
FIG. 13 is a plan view showing an exemplary planar layout of the semiconductor device according to a second modification.
Figure 14:
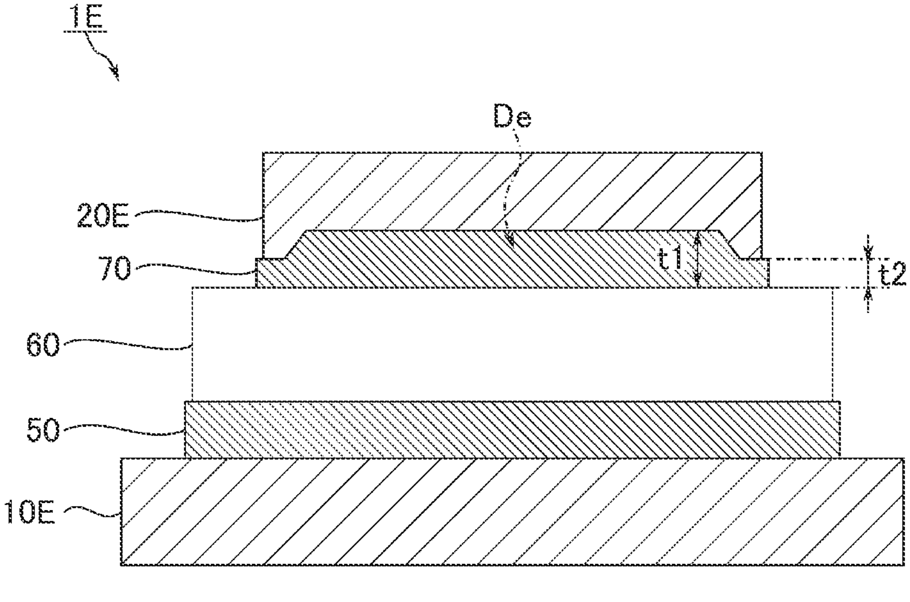
FIG. 14 is a sectional view taken along line XIV-XIV indicated in FIG. 13 and shows an exemplary sectional structure of the semiconductor device according to the second modification.

FIG. 13 is a plan view showing an exemplary planar layout of the semiconductor device according to a second modification. FIG. 14 is a sectional view taken along line XIV-XIV indicated in FIG. 13 and shows an exemplary sectional structure of the semiconductor device according to the second modification. FIGS. 13 and 14 correspond to FIGS. 3 and 4 in the first embodiment.

As shown in FIGS. 13 and 14, the semiconductor device 1E includes a collector electrode 10E, two emitter electrodes 20E, two gate electrodes 30, a sealing material 40 (not shown), two bonding materials 50, two pellets 60, two bonding materials 70, and two wires 80. The two gate electrodes 30, the sealing material 40, the two bonding materials 50, the two pellets 60, the two bonding materials 70, and the two wires 80 are the same as those in the first embodiment.

In the second modification, depressions De are respectively formed in the lower portions of the two emitter electrodes 20E, not on the upper portion of the collector electrode 10E. In the bottom surface of the emitter electrode 20E, the region corresponding to the inner portion of the depression De is located below the region corresponding to the outside of the depression De.

The area of each depression De when viewed in the vertical direction is smaller than the area of the pad corresponding to the emitter on the top surface of the corresponding pellet 60. Each of the two depressions De is included in the region that surrounds the pad corresponding to the emitter on the top surface of the corresponding pellet 60 and does not surround the pad corresponding to the gate, when viewed in the vertical direction.

The bonding material 70 is provided in such a manner that the corresponding depression De is embedded by the bonding material 50. The bonding material 70 between the emitter electrode 20E and the corresponding pellet 60 is designed to have a maximum thickness t1 of 100 μm or greater, for example. A lower limit value is set for the maximum thickness t1 of the bonding material 70 in order to meet a request for a thickness required to ensure occurrence of a short circuit between the emitter electrode 20E and the corresponding pellet 60 when the pellet 60 malfunctions. The bonding material 70 is designed in such a manner that an upper limit value of the maximum thickness t1 is 300 μm or greater and 500 μm or less, for example.

The bonding material 70 may contain spherical nickel. The maximum value of the diameter of the spherical nickel contained in the bonding material 70 is on the order of 80 μm, for example. By including such spherical nickel in the bonding material 70, it is possible to design the portion of the bonding material 70 located below the depression De to have a thickness t2 less than 90 μm, for example. The bonding material 70 does not necessarily contain spherical nickel. In this case, the thickness t2 of the portion of the bonding material 70 located below the depression De may be thin enough to be negligible.

The bonding material 70 is designed in such a manner that the thickness (t1-t2) of the portion in which the depression De is embedded satisfies the above-described restrictions on the thickness t1 and is associated with the designed value of the thickness t2.

According to the second embodiment, a depression De is formed in the lower portion of the emitter electrode 20E. When viewed in the vertical direction, the region in which the depression De is formed is smaller than the region that surrounds the pad corresponding to the emitter in the top surface of the pellet 60 and does not surround the pad corresponding to the gate and is included in the top surface of the pellet 60. It is thereby possible to couple the emitter electrode 20E to the pellet 60 via the bonding material 70 formed in the depression De, even when these components are pressed in the vertical direction during the manufacturing process. The depression De is formed in such a manner that the thickness t1 of the bonding material 70 is 100 μm or greater. For this reason, a short-circuit between the emitter electrode 20E and the pellet 60 can be ensured when the pellet 60 malfunctions. Accordingly, it is possible to suppress degradation of the reliability of the semiconductor device 1E.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

a pellet;

a first conductor and a second conductor between which the pellet is interposed in a first direction;

a first bonding material that bonds the pellet and the first conductor; and a second bonding material that bonds the pellet and the second conductor, wherein a first surface of the first conductor facing the pellet has a depression, and a distance between the first surface and a center portion of the pellet is larger than a distance between the first surface and a peripheral portion of the pellet.

2. The semiconductor device according to claim 1, wherein the depression overlaps the pellet and is smaller than the pellet when viewed in the first direction.

3. The semiconductor device according to claim 2, wherein the first surface of the first conductor has a projection in a region outside the depression in a region that overlaps the pellet when viewed in the first direction.

4. The semiconductor device according to claim 2, wherein the first surface of the first conductor has a groove extending from a side surface of the depression toward a region that does not overlap the pellet when viewed in the first direction.

5. The semiconductor device according to claim 1, wherein when viewed in the first direction, the depression is larger than the pellet, and includes a first region that overlaps the center portion of the pellet and a second region that overlaps the peripheral portion of the pellet and an outer side of the pellet, and a depth of the depression is deeper in the first region than in the second region.

6. The semiconductor device according to claim 5, wherein the first surface of the first conductor has a projection in a region that overlaps the pellet in the second region when viewed in the first direction.

7. The semiconductor device according to claim 1, wherein the first bonding material and the second bonding material include solder.

8. The semiconductor device according to claim 7, wherein the first bonding material includes spherical nickel.

9. The semiconductor device according to claim 1, wherein in a region that overlaps the depression when viewed in the first direction, a thickness of the first bonding material is 100 μm or greater.

10. The semiconductor device according to claim 3, wherein a height of the projection is less than 100 μm.

11. The semiconductor device according to claim 6, wherein a height of the projection is less than 100 μm.

12. The semiconductor device according to claim 1, wherein the first conductor is larger than the pellet when viewed in the first direction.

13. The semiconductor device according to claim 1, wherein the first conductor is smaller than the pellet when viewed in the first direction.

14. The semiconductor device according to claim 1, wherein the pellet includes a chip of a power semiconductor.

15. The semiconductor device according to claim 14, wherein the pellet includes an insulated gate bipolar transistor.

16. The semiconductor device according to claim 15, wherein the first conductor includes a collector electrode, and the second conductor includes an emitter electrode.

17. The semiconductor device according to claim 14, wherein the pellet includes a metal-oxide-silicon field-effect transistor using silicon carbide.

18. The semiconductor device according to claim 17, wherein the first conductor includes a drain electrode, and the second conductor includes a source electrode.

* * * * *